United States Patent

Chen

[11] Patent Number: 5,970,376
[45] Date of Patent: Oct. 19, 1999

[54] POST VIA ETCH PLASMA TREATMENT METHOD FOR FORMING WITH ATTENUATED LATERAL ETCHING A RESIDUE FREE VIA THROUGH A SILSESQUIOXANE SPIN-ON-GLASS (SOG) DIELECTRIC LAYER

[75] Inventor: Chao-Cheng Chen, Matou, Taiwan

[73] Assignee: Taiwan Semiconductor Manufacturing Company, Ltd., Hsin-Chu, Taiwan

[21] Appl. No.: 08/999,075

[22] Filed: Dec. 29, 1997

[51] Int. Cl.$^6$ ................................................. H01L 21/4763
[52] U.S. Cl. .......................... 438/637; 438/639; 438/689; 438/723; 438/734; 438/963; 438/725; 134/1.1; 134/1.2; 134/1.3; 216/17; 216/39; 216/67
[58] Field of Search ...................................... 438/637, 639, 438/689, 723, 725, 734, 963; 134/1.1, 1.2, 1.3; 216/17, 39, 67

[56] References Cited

U.S. PATENT DOCUMENTS

| | | | |
|---|---|---|---|
| 4,961,820 | 10/1990 | Shinagawa et al. | 156/643 |
| 5,269,880 | 12/1993 | Jolly et al. | 156/643 |
| 5,380,401 | 1/1995 | Jones et al. | 156/665 |
| 5,384,009 | 1/1995 | Mak et al. | 156/662 |
| 5,401,358 | 3/1995 | Kadomura | 156/651 |
| 5,432,073 | 7/1995 | Wu et al. | 437/195 |
| 5,474,615 | 12/1995 | Ishida et al. | 134/1.2 |
| 5,560,803 | 10/1996 | Mihara et al. | 156/643.1 |
| 5,670,426 | 9/1997 | Kuo et al. | 437/195 |
| 5,770,098 | 3/1994 | Araki et al. | 216/67 |
| 5,783,493 | 1/1997 | Yeh et al. | 438/718 |
| 5,804,091 | 7/1996 | Lo et al. | 216/100 |
| 5,858,879 | 6/1997 | Chao et al. | 438/725 |
| 5,882,489 | 4/1996 | Bersin et al. | 204/192.35 |
| 5,904,154 | 7/1997 | Chien et al. | 134/1.2 |

*Primary Examiner*—John F. Niebling
*Assistant Examiner*—David A. Zarneke
*Attorney, Agent, or Firm*—George O. Saile; Stephen B. Ackerman; Alek P. Szecsy

[57] ABSTRACT

A method for forming a via through a dielectric layer within a microelectronics fabrication. There is first provided a substrate employed within a microelectronics fabrication. There is then formed over the substrate a low dielectric constant dielectric layer, where the low dielectric constant dielectric layer is formed from a silsesquioxane spin-on-glass (SOG) dielectric material. There is then formed over the low dielectric constant dielectric layer a patterned photoresist layer. There is then etched through use of a fluorine containing plasma etch method while employing the patterned photoresist layer as a photoresist etch mask layer the low dielectric constant dielectric layer to form a patterned low dielectric constant dielectric layer having a via formed therethrough. The fluorine containing plasma etch method employing a fluorine containing etchant gas composition which simultaneously forms a fluorocarbon polymer residue layer upon a sidewall of the via. There is then treated through use of a plasma treatment method the fluorocarbon polymer residue layer to form a plasma treated fluorocarbon polymer residue layer. The plasma treated fluorocarbon polymer residue layer is susceptible, in comparison with the fluorocarbon polymer residue layer, to being stripped from the sidewall of the via through an oxygen containing plasma stripping method employed in stripping from the microelectronics fabrication the patterned photoresist layer with attenuated lateral etching of the patterned low dielectric constant dielectric layer. Finally, there is then stripping through use of the oxygen containing plasma stripping method the patterned photoresist layer from over patterned low dielectric constant dielectric layer and the plasma treated fluorocarbon polymer residue layer from upon the sidewall of the via.

13 Claims, 5 Drawing Sheets

POST VIA ETCH PLASMA TREATMENT METHOD FOR FORMING WITH ATTENUATED LATERAL ETCHING A RESIDUE FREE VIA THROUGH A SILSESQUIOXANE SPIN-ON-GLASS (SOG) DIELECTRIC LAYER

BACKGROUND OF THE INVENTION

1. Field of the Invention

The present invention relates generally to dielectric layers formed within microelectronics fabrications. More particularly, the present invention relates to methods for forming vias through dielectric layers formed within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and conductor element dimensions have decreased, it has become more common within the art of microelectronics fabrications to form interposed between the patterns of patterned microelectronics conductor layers within microelectronics fabrications low dielectric constant microelectronics dielectric layers. Low dielectric constant microelectronics dielectric layers within microelectronics fabrications are typically formed from low dielectric constant dielectric materials such as but not limited to silsesquioxane spin-on-glass (SOG) dielectric materials and organic polymer spin-on-polymer dielectric materials. Particularly prevalent in the art of microelectronics fabrication are low dielectric constant dielectric layers formed through spin coating and thermal curing of silsesquioxane spin-on-glass (SOG) dielectric materials.

Silsesquioxane spin-on-glass (SOG) dielectric materials are characterized by the general chemical formula R1—Si(OR2)3, where: (1) R1 may be any of several radicals, including but not limited to hydrogen radical and carbon bonded organic radicals, but not oxygen bonded radicals; and (2) R2 is typically, although not exclusively, a carbon bonded organic radical such as but not limited to a methyl radical (—CH3) and an ethyl radical (—C2H5). Such silsesquioxane spin-on-glass (SOG) dielectric materials are typically spin-coated and subsequently thermally cured at temperatures of from about 400 to about 500 degrees centigrade to form within microelectronics fabrications low dielectric constant dielectric layers.

Low dielectric constant dielectric layers formed from silsesquioxane spin-on-glass (SOG) dielectric materials are desirable interposed between the patterns of patterned microelectronics conductor layers within microelectronics fabrications since there is thus typically efficiently and manufacturably formed a microelectronics fabrication with enhanced microelectronics fabrication circuit speed, decreased patterned microelectronics conductor layer parasitic capacitance and decreased patterned microelectronics conductor layer cross-talk. While low dielectric constant dielectric layers formed from silsesquioxane spin-on-glass (SOG) dielectric materials within microelectronics fabrications are thus desirable within the art of microelectronics fabrication, low dielectric constant dielectric layers are not formed entirely without problems from silsesquioxane spin-on-glass (SOG) dielectric materials within microelectronics fabrications.

In particular, it is known in the art of microelectronics fabrication that when forming through a low dielectric constant dielectric layer formed from a silsesquioxane spin-on-glass (SOG) dielectric material a via through use of a conventional fluorine containing plasma etch method employing an etchant gas composition comprising a fluorine containing etchant gas, such as but not limited to a fluorocarbon fluorine containing etchant gas, there is typically formed upon a sidewall of the via formed through the low dielectric constant dielectric layer a fluorocarbon polymer residue layer which when subsequently simultaneously removed through an oxygen containing plasma stripping method along with a patterned photoresist layer employed in defining the via laterally etches the low dielectric constant dielectric layer exposed within the via to form a laterally etched via. A series of schematic cross-sectional diagrams illustrating the results of progressive stages in forming such a laterally etched via within such a low dielectric constant dielectric layer which in part defines the laterally etched via is shown within the schematic cross-sectional diagrams of FIG. 1 to FIG. 3.

Figure 1:
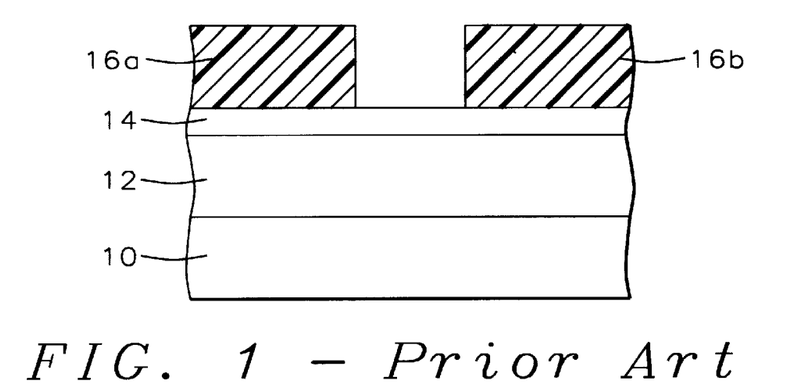
FIG. 1 to FIG. 3 show a series of schematic cross-sectional diagrams illustrating the results of forming within a microelectronics fabrication a laterally etched via through a low dielectric constant dielectric layer formed of a silsesquioxane spin-on-glass (SOG) dielectric material in accord with a method conventional in the art of microelectronics fabrication.

Shown in FIG. 1 is a substrate 10 employed within a microelectronics fabrication, where the substrate 10 has formed thereupon a blanket low dielectric constant dielectric layer 12 formed from a silsesquioxane spin-on-glass (SOG) dielectric material. There is in turn formed upon the blanket low dielectric constant dielectric layer 12 a blanket silicon containing dielectric layer 14 which is typically formed of a silicon containing dielectric material such as but not limited to a silicon oxide dielectric material, a silicon nitride dielectric material or a silicon oxynitride dielectric material. Finally, there is formed upon the blanket silicon containing dielectric layer 14 a pair of patterned photoresist layers 16a and 16b.

Figure 2:
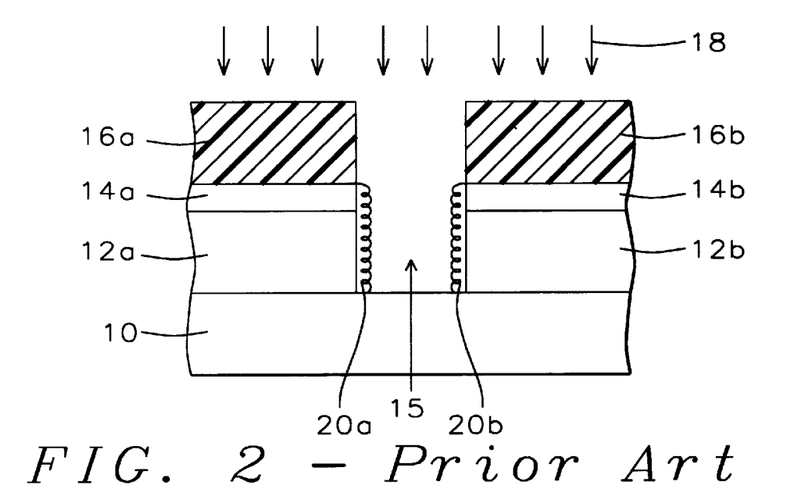

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is schematic cross-sectional diagram of a microelectronics fabrication otherwise equivalent to the microelectronics fabrication whose schematic cross-sectional diagram is illustrated in FIG. 1, but wherein the blanket silicon containing dielectric layer 14 and the blanket low dielectric constant dielectric layer 12 have been sequentially patterned through use of a fluorine containing etching plasma 18, while employing the patterned photoresist layers 16a and 16b as an etch mask, to form: (1) the corresponding patterned silicon containing dielectric layers 14a and 14b; and (2) the corresponding patterned low dielectric constant dielectric layers 12a and 12b, which in the aggregate define a via 15 accessing the substrate 10. Upon the sidewalls of the via 15 there is formed a pair of fluorocarbon polymer residue layers 20a and 20b.

The fluorocarbon polymer residue layers 20a and 20b typically derive from fluorine and carbon within a fluorocarbon etchant gas composition employed within the fluorine containing etching plasma 18, if a fluorocarbon etchant gas composition is employed therein, or in the alternative from fluorine within the fluorine containing etchant gas composition along with carbon which may be obtained through slight etching of the patterned photoresist layers 16a and 16b.

Figure 3:
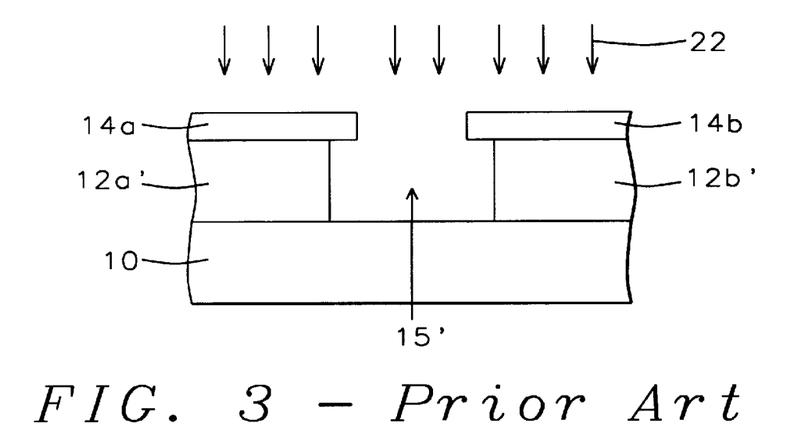

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication in-part otherwise equivalent to the microelectronics fabrication whose schematic cross-sectional diagram is illustrated in FIG. 2, but wherein the patterned photoresist layers 16a and 16b, and the fluorocarbon polymer residue layers 20a and 20b, have been stripped from the microelectronics fabrication through use of an oxygen containing stripping plasma 22 typically employing conventional oxygen containing stripping plasma conditions including a reactor chamber pressure of from about 10 to about 20 torr. In the process of stripping from the microelectronics fabrication whose schematic cross-sectional diagram is illustrated in FIG. 2 the patterned photoresist layers 16a and 16b, and the fluorocarbon polymer residue layers 20a and 20b, to form the microelectronics fabrication whose schematic cross-sectional diagram is illustrated in FIG. 3, there is simultaneously typically also laterally etched the patterned low dielectric constant dielectric layers 12a and 12b exposed within the via 15 sidewalls to form the laterally etched low dielectric constant dielectric layers 12a' and 12b' as illustrated in FIG. 3, which in conjunction with the patterned silicon containing dielectric layers 14a and 14b define a laterally etched via 15'.

Microelectronics fabrications analogous or equivalent to the microelectronics fabrication whose schematic cross-sectional diagram is illustrated in FIG. 3 are undesirable within the art of microelectronics fabrication since it is often difficult to subsequently form void free microelectronics layers, such as but not limited to void free patterned microelectronics conductor stud layers, within undercut vias such as the laterally etched via 15'. It is thus towards the goal of forming within a microelectronics fabrication through a fluorine containing plasma etch method a via through a low dielectric constant dielectric layer formed of a silsesquioxane spin-on-glass (SOG) dielectric material while attenuating lateral etching of the via when stripping from the microelectronics fabrication through an oxygen containing plasma stripping method a patterned photoresist layer employed in defining the via and a fluorocarbon polymer residue layer formed upon a sidewall of the via incident to the fluorine containing plasma etch method, that the present invention is generally directed.

Various novel plasma etch methods and materials have been disclosed in the art of microelectronics fabrication.

For example, Shinagawa et al., in U.S. Pat. No. 4,961,820, discloses an oxygen containing plasma stripping method for stripping from an integrated circuit microelectronics fabrication a photoresist layer employed in fabricating the integrated circuit microelectronics fabrication. The method employs a reactant gas composition comprising oxygen, water vapor or hydrogen and an additional gas in proportions such that: (1) a stripping rate of the photoresist layer is higher than observed with an otherwise equivalent reactant gas composition absent the additional gas; and (2) an activation energy of the photoresist layer stripping reaction is lower than an activation energy of the photoresist layer stripping reaction absent the additional gas.

In addition, Jolly et al., in U.S. Pat. No. 5,269,880, discloses: (1) a method for forming through an insulator layer within an integrated circuit microelectronics fabrication a via with tapered sidewalls, which via accesses a conductor layer within the integrated circuit microelectronics fabrication; and (2) the integrated circuit microelectronics fabrication having formed therein the insulator layer having formed therethrough the via with the tapered sidewalls, which via accesses the conductor layer within the integrated circuit microelectronics fabrication.

The method employs a protective layer formed over an insulator layer having a steep sided via formed therethrough, which steep sided via accesses the conductor layer, where the protective layer is additionally formed upon the steep sided via sidewalls and the conductor layer, and where the protective layer and part of the insulator layer are subsequently removed through a sputter etch method to form from the steep sided via the via with the tapered sidewalls.

Further, Jones et al., in U.S. Pat. No. 5,380,401, discloses a method for removing from aluminum containing bond pads within integrated circuit microelectronics fabrications aluminum/fluorine/oxide residues which otherwise impede formation of fully functional or reliable electrical connections to those aluminum containing bond pads. The method employs an argon plasma etching of the aluminun/fluorine/oxide residues, the argon plasma optionally employing a carrier gas such as carbon dioxide, or an inert gas such as helium, neon, krypton or xenon.

Yet further, Wu et al., in U.S. Pat. No. 5,432,073, discloses a method for forming within vias formed through spin-on-glass (SOG) dielectric layers within integrated circuit microelectronics fabrications patterned metal conductor interconnection layers which access lower lying patterned conductor layers within the integrated circuit microelectronics fabrications. The method employs an argon plasma etching of a residual polymer layer and a native oxide layer formed upon the lower lying patterned conductor layer, followed by degassing the spin-on-glass (SOG) layer exposed within the via sidewall prior to forming the patterned conductor metal interconnection layer within the via.

Finally, Mihara et al., in U.S. Pat. No. 5,560,803, discloses a method for oxygen plasma ashing with a uniform ashing rate a photoresist layer from upon a semiconductor substrate within an integrated circuit microelectronics fabrication ashed within a plasma reactor chamber. The method employs providing and maintaining a flow of a non-activated oxygen containing gas within the plasma reactor chamber before either generating a plasma within the plasma reactor chamber or ashing the photoresist layer within the plasma reactor chamber.

Desirable in the art of microelectronics fabrication are fluorine containing plasma etch methods through which a via may be formed through a low dielectric constant dielectric layer formed of a silsesquioxane spin-on-glass (SOG) dielectric material within a microelectronics fabrication with attenuated lateral etching of the via when stripping from the microelectronics fabrication through an oxygen containing plasma stripping method a patterned photoresist layer employed in defining the via and a fluorocarbon polymer residue layer formed upon the via sidewall incident to the fluorine containing plasma etch method. Particularly desirable within the art of integrated circuit microelectronics fabrication are fluorine containing plasma etch methods through which a via may be formed through a low dielectric constant dielectric layer formed of a silsesquioxane spin-on-glass (SOG) dielectric material within an integrated circuit microelectronics fabrication with attenuated lateral etching of the via when stripping from the integrated circuit microelectronics fabrication through an oxygen containing plasma stripping method a patterned photoresist layer employed in defining the via and a fluorocarbon polymer residue layer formed upon the via sidewall incident to the fluorine containing plasma etch method. It is towards these goals that the present invention is both generally and more specifically directed.

SUMMARY OF THE INVENTION

A first object of the present invention is to provide a fluorine containing plasma etch method for forming within a microelectronics fabrication a via through a low dielectric constant dielectric layer formed of a silsesquioxane spin-on-glass (SOG) dielectric material.

A second object of the present invention is to provide a method in accord with the first object of the present invention, where the via is formed with attenuated lateral etching of the via when stripping from the microelectronics fabrication through an oxygen containing plasma stripping method a photoresist etch mask layer employed in defining the via and a fluorocarbon polymer residue layer formed upon the via sidewall incident to forming the via through the fluorine containing plasma etch method.

A third object of the present invention is to provide a method in accord with the first object of the present invention and the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a method for forming a via through a dielectric layer within a microelectronics fabrication. To practice the method of the present invention, there is first provided a substrate employed within a microelectronics fabrication. There is then formed over the substrate a low dielectric constant dielectric layer. The low dielectric constant dielectric layer is formed from a silsesquioxane spin-on-glass (SOG) dielectric material. There is then formed over the low dielectric constant dielectric layer a patterned photoresist layer. There is then etched through use of a fluorine containing plasma etch method while employing the patterned photoresist layer as a photoresist etch mask layer the low dielectric constant dielectric layer to form a patterned low dielectric constant dielectric layer having a via formed therethrough. The fluorine containing plasma etch method employs a fluorine containing etchant gas composition which simultaneously forms a fluorocarbon polymer residue layer upon a sidewall of the via. There is then treated through use of a plasma treatment method the fluorocarbon polymer residue layer to form a plasma treated fluorocarbon polymer residue layer. The plasma treated fluorocarbon polymer residue layer is susceptible, in comparison with the fluorocarbon polymer residue layer, to being stripped from the sidewall of the via through an oxygen containing plasma stripping method employed in stripping from the microelectronics fabrication the patterned photoresist layer with attenuated lateral etching of the patterned low dielectric constant dielectric layer. Finally, there is then stripped through use of the oxygen containing plasma stripping method the patterned photoresist layer from over patterned low dielectric constant dielectric layer and the plasma treated fluorocarbon polymer residue layer from upon the sidewall of the via.

The present invention provides a fluorine containing plasma etch method for forming within a microelectronics fabrication a via through a low dielectric constant dielectric layer formed of a silsesquioxane spin-on-glass (SOG) dielectric material, where the via is formed with attenuated lateral etching of the via when stripping from the microelectronics fabrication through an oxygen containing plasma stripping method a photoresist etch mask layer employed in defining the via and a fluorocarbon polymer residue layer formed upon the via sidewall incident to the fluorine containing plasma etch method. The method of the present invention realizes the foregoing objects by employing a plasma treatment of the fluorocarbon polymer residue layer formed upon the via sidewall prior to stripping from the microelectronics fabrication through the oxygen containing plasma stripping method the photoresist etch mask layer employed in defining the via and the plasma treated fluorocarbon polymer residue layer thus formed upon the via sidewall. While the mechanism through which the method of the present invention provides a via through a low dielectric constant dielectric layer formed of a silsesquioxane spin-on-glass (SOG) dielectric material to form a patterned low dielectric constant dielectric layer with attenuated lateral etching of the via is not entirely clear, it is believed that the plasma treatment method of the present invention assists in defluorinating the fluorocarbon polymer residue layer when forming the plasma treated fluorocarbon polymer residue layer, so that there exists within the plasma treated fluorocarbon polymer residue layer a reduced fluorine content which would otherwise assist in laterally etching the via to form a laterally etched via.

The method of the present invention may be employed where the microelectronics fabrication is an integrated circuit microelectronics fabrication. Although the method of the present invention may have greater practical utility when forming with attenuated lateral etching within integrated circuit microelectronics fabrications vias through low dielectric constant dielectric layers formed of silsesquioxane spin-on-glass (SOG) dielectric materials, the method of the present invention does not discriminate with respect to the nature of a microelectronics fabrication within which is formed a low dielectric constant dielectric layer formed of a silsesquioxane spin-on-glass (SOG) dielectric material, the low dielectric constant dielectric layer having formed therethrough a via in accord with the method of the present invention. Thus, the present invention may be employed in forming vias through low dielectric constant dielectric layers formed of silsesquioxane spin-on-glass (SOG) dielectric materials within microelectronics fabrications including but not limited to integrated circuit microelectronics fabrications, solar cell microelectronics fabrications, ceramic substrate microelectronics fabrications and flat panel display microelectronics fabrications.

The method of the present invention is readily manufacturable. The method of the present invention employs: (1) a fluorine containing plasma etch method; (2) an intervening fluorocarbon polymer residue layer plasma treatment method; and (3) an oxygen containing plasma stripping method, for forming within a microelectronics fabrication a via through a low dielectric constant dielectric layer formed of a silsesquioxane spin-on-glass (SOG) dielectric material. Since plasma methods are generally known in the art of microelectronics fabrication, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a fluorine containing plasma etch method for forming within a microelectronics fabrication a via through a low dielectric constant dielectric layer formed of a silsesquioxane spin-on-glass (SOG) dielectric material, while attenuating lateral etching of the via when stripping from the microelectronics fabrication through an oxygen containing plasma stripping method a patterned photoresist layer employed in defining the via and a fluorocarbon polymer residue layer formed upon a sidewall of the via incident to the fluorine containing plasma etch method. The method of the present invention realizes the foregoing objects by plasma treating the fluorocarbon polymer residue layer to form a plasma treated fluorocarbon polymer residue layer prior to stripping from the microelectronics fabrication through the oxygen containing plasma stripping method the patterned photoresist layer employed in defining the via and the plasma treated fluorocarbon polymer residue layer thus formed upon the sidewall of the via.

Although the method of the present invention has particular value when forming within integrated circuit microelectronics fabrications interconnection vias through low dielectric constant dielectric layers to access patterned conductor layers within those integrated circuit microelectronic fabrications, the method of the present invention may generally be employed in forming vias through low dielectric constant dielectric layers formed of silsesquioxane spin-on-glass (SOG) dielectric materials within microelectronics fabrications including but not limited to integrated circuit microelectronics fabrications, solar cell microelectronics fabrications, ceramic substrate microelectronics fabrication and flat panel display microelectronics fabrications. Similarly, a low dielectric constant dielectric layer through which may be formed a via through the method of the present invention may be formed within any of several dielectric layer locations within a microelectronics fabrication, including but not limited to a pre-metal dielectric (PMD) layer location, an inter-metal dielectric (IMD) dielectric layer location and a passivation (ie: post metal) dielectric layer location.

FIRST PREFERRED EMBODIMENT

Figure 4:
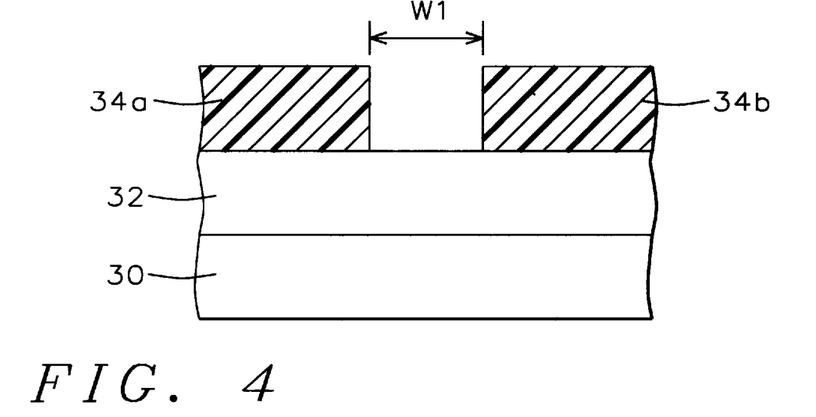
FIG. 4 to FIG. 7 show a series of schematic cross-sectional diagrams illustrating the results of forming within a microelectronics fabrication in accord with a general preferred embodiment of the present invention which comprises a first preferred embodiment of the present invention a via through a low dielectric constant dielectric layer formed of a silsesquioxane spin-on-glass (SOG) dielectric material, with attenuated laterally etching of the via.

Referring now to FIG. 4 to FIG. 7, there is shown a series of schematic cross-sectional diagrams illustrating the results of forming within a microelectronics fabrication in accord with a general preferred embodiment of the present invention which comprises a first preferred embodiment of the present invention a via through a low dielectric constant dielectric layer formed from a silsesquioxane spin-on-glass (SOG) dielectric material, with attenuated lateral etching of the via. Shown in FIG. 4 is a schematic cross-sectional diagram of the microelectronics fabrication at an early stage in its fabrication.

Shown in FIG. 4 is a substrate 30 employed within a microelectronics fabrication, where the substrate 30 has formed thereupon a blanket low dielectric constant dielectric layer 32. In turn, the blanket low dielectric constant dielectric layer 32 has formed thereupon a pair of patterned photoresist layers 34a and 34b.

Within the first preferred embodiment of the present invention as illustrated within the schematic cross-sectional diagram of FIG. 4, the substrate 30 may be employed in forming a microelectronics fabrication including but not limited to an integrated circuit microelectronics fabrication, a solar cell microelectronics fabrication, a ceramic substrate microelectronics fabrication and a flat panel display microelectronics fabrication. Although not specifically illustrated within the schematic cross-sectional diagram of FIG. 4, the substrate 30 may be a substrate by itself employed within the microelectronics fabrication, or the substrate 30 may alternatively be the substrate employed within the microelectronics fabrication, where the substrate has formed thereupon and/or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

With respect to the blanket low dielectric constant dielectric layer 32, within the first preferred embodiment of the present invention the blanket low dielectric constant dielectric layer 32 is formed from a silsesquioxane spin-on-glass (SOG) dielectric material. As discussed above within the Description of the Related Art, silsesquioxane spin-on-glass (SOG) dielectric materials are characterized by the general chemical formula R1—Si(OR2)3, where: (1) R1 may be any of several radicals, including but not limited to a hydrogen radical and a carbon bonded organic radicals, but not oxygen bonded radicals; and (2) R2 is typically, although not exclusively, a carbon bonded organic radical such as but not limited to a methyl radical (—CH3) or an ethyl radical (—C2H5). Thus, within the first preferred embodiment of the present invention the blanket low dielectric constant dielectric layer 32 is preferably formed from a silsesquioxane spin-on-glass (SOG) dielectric material chosen from the group of silsesquioxane spin-on-glass (SOG) dielectric materials including but not limited to: (1) hydrogen silsesquioxane spin-on-glass (SOG) dielectric materials (H—Si (OR)3); (2) carbon bonded organo functional silsesquioxane spin-on-glass (SOG) dielectric materials such as but not limited to methyl silsesquioxane spin-on-glass (SOG) dielectric materials (CH3—Si(OR)3), ethyl silsesquioxane spin-on-glass (SOG) dielectric materials (C2H5—Si(OR)3) and other carbon bonded organo functional silsesquioxane spin-on-glass (SOG) dielectric materials; and (3) carbon bonded fluorocarbon functional silsesquioxane spin-on-glass (SOG) dielectric materials such as but not limited to perfluoromethyl silsesquioxane spin-on-glass (SOG) dielectric materials (CF3—Si(OR)3) and perfluoroethyl silsesquioxane spin-on-glass (SOG) dielectric materials (C2F5—Si (OR)3), where R typically equals a carbon bonded organic radical, such as but not limited to a methyl radical (—CH3) or an ethyl radical (—C2H5). Preferably, the low dielectric constant dielectric layer 32 so formed is formed to a thickness of from about 500 to about 5000 angstroms after thermal curing at a temperature of from about 400 to about 500 degrees centigrade.

With respect to the patterned photoresist layers 34a and 34b, within the first preferred embodiment of the present invention the patterned photoresist layers 34a and 34b may be formed from any of several photoresist materials as are conventionally employed in the art of microelectronics fabrication, including photoresist materials chosen from the general groups of photoresist materials including but not limited to positive photoresist materials and negative photoresist materials. Preferably, the patterned photoresist layers 34a and 34b so formed are each formed to a thickness of from about 10000 to about 16000 angstroms upon the blanket low dielectric constant dielectric layer 32 to define an aperture of width WI as illustrated in FIG. 4 of from about 3500 to about 10000 angstroms leaving exposed the blanket low dielectric constant dielectric layer 32.

Figure 5:
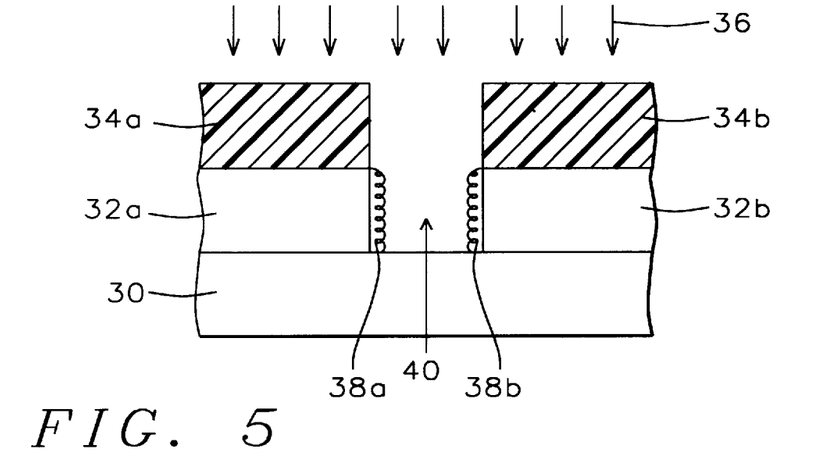

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket low dielectric constant dielectric layer 32 has been patterned to form a pair of patterned low dielectric constant dielectric layers 32a and 32b through use of a fluorine containing etching plasma 36 while employing the pair of patterned photoresist layers 34a and 34b as an etch mask layer. The pair of patterned low dielectric constant dielectric layers 32a and 32b so formed defines a via 40. Incident to forming the patterned low dielectric constant dielectric layers 32a and 32b from the blanket low dielectric constant dielectric layer 32 through the fluorine containing plasma etch method employing the fluorine containing etching plasma 36, there is formed upon the sidewalls of the via 40 a pair of fluorocarbon polymer residue layers 38a and 38b.

Within the first preferred embodiment of the present invention, the fluorine containing etching plasma 36 is a fluorine containing etching plasma which employs an etchant gas composition employing at least one fluorine containing etchant gas chosen from the group of fluorine containing etchant gases including but not limited to perfluorocarbons (preferably of no greater than three carbon atoms), hydrofluorocarbons (preferably of no greater than three carbon atoms), sulfur hexafluoride and nitrogen trifluoride. The fluorocarbon polymer residue layers 38a and 38b formed through use of the fluorine containing etching plasma 36 derive from perfluorocarbon or hydrofluorocarbon etchant gases employed within the fluorine containing etching plasma 36, if such perfluorocarbon or hydrofluorocarbon etchant gases are employed therein. In the alternative, the fluorocarbon polymer residue layers 38a and 38b may also derive from fluorine species within the fluorine containing etching plasma 36, along with carbon derived from slight etching of the patterned photoresist layers 34a and 34b.

Preferably, the fluorine containing etching plasma 36 also employs. (1) a reactor chamber pressure of from about 50 to about 150 mtorr; (2) a radio frequency plasma power of from about 500 to about 1200 watts at a radio frequency of 13.56 MHZ; (3) a substrate 30 temperature of from about 10 to about 60 degrees centigrade; and (4) a fluorine containing plasma etchant gas flow rate of from about 30 to about 90 standard cubic centimeters per minute (sccm), for a time period sufficient to completely etch through the blanket low dielectric constant dielectric layer 32 and fully expose the substrate 30.

Figure 6:
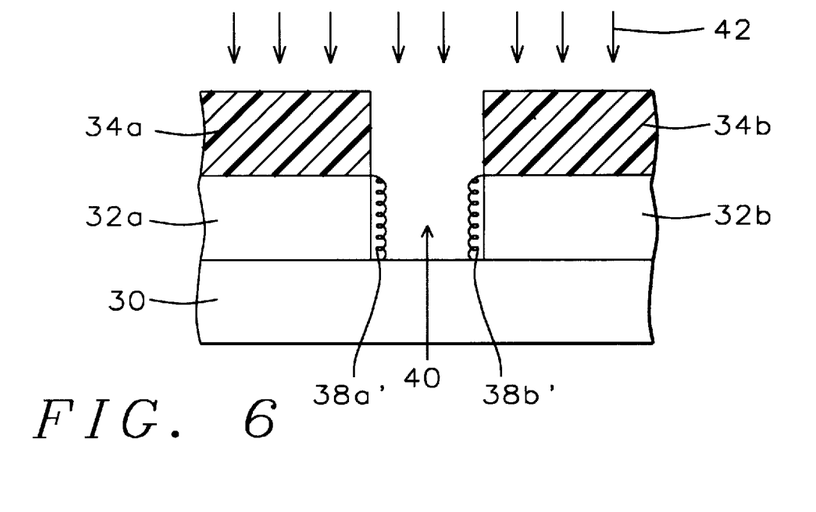

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram of FIG. 5, but wherein the fluorocarbon polymer residue layers 38a and 38b have been treated with a fluorocarbon polymer residue layer treatment plasma 42 to form the plasma treated fluorocarbon polymer residue layers 38a' and 38b'. Within the first preferred embodiment of the present invention, the fluorocarbon polymer residue layers 38a and 38b are treated with the fluorocarbon polymer residue layer treatment plasma 42 under conditions such that the plasma treated fluorocarbon polymer residue layers 38a' and 38b', in comparison with the fluorocarbon polymer residue layers 38a and 38b, are more readily stripped from the microelectronics fabrication whose schematic cross-sectional diagram is illustrated in FIG. 6 within an oxygen containing plasma stripping method through which is stripped the patterned photoresist layers 34a and 34b from the patterned low dielectric constant dielectric layers 32a and 32b, with attenuated lateral etching of the patterned low dielectric constant dielectric layers 32a and 32b which define the via 40.

Within the first preferred embodiment of the present invention, the fluorocarbon polymer residue layer treatment plasma 42 preferably employs a reactant gas composition comprising a chemically inert reactant gas chosen from the group of chemically inert reactant gases consisting of argon, neon, xenon and krypton, and mixtures thereof. More preferably, the fluorocarbon polymer residue layer treatment plasma 42 employs a reactant gas composition comprising argon. Most preferably, the fluorocarbon polymer residue layer treatment plasma 42 employs a reactant gas composition consisting of argon. Preferably, the fluorocarbon polymer residue layer treatment plasma 42 also employs: (1) a reactor chamber pressure of from about 30 to about 100 mtorr; (2) a radio frequency power of from about 500 to about 1500 watts at a radio frequency of 13.56 MHZ; (3) a substrate 30 temperature of from about 10 to about 60 degrees centigrade; and (4) an inert gas flow rate of from about 50 to about 150 standard cubic centimeters per minute (sccm).

Figure 7:
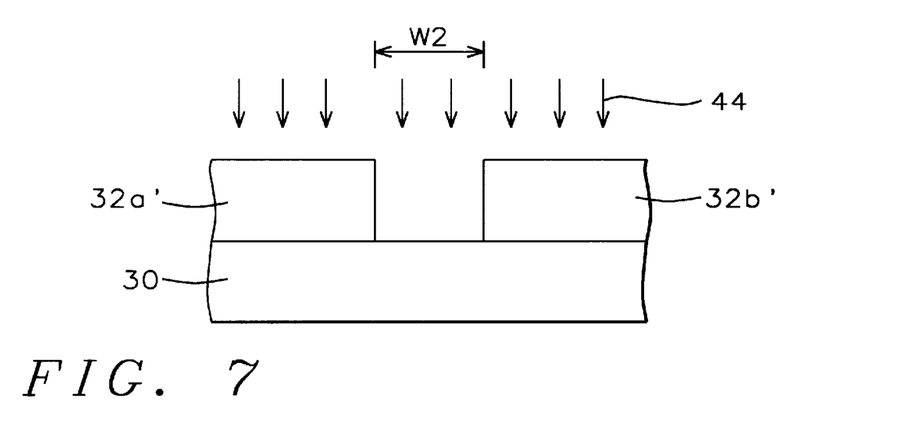

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the patterned photoresist layers 34a and 34b, and the plasma treated fluorocarbon polymer residue layers 38a' and 38b', have been stripped from the microelectronics fabrication through use of an oxygen containing stripping plasma 44 while simultaneously forming the minimally laterally etched low dielectric constant dielectric layers 32a' and 32b' which define a laterally etched via 40' of width W2.

Within the first preferred embodiment of the present invention, the oxygen containing stripping plasma 44 may employ an oxygen containing stripping gas chosen from the group of oxygen containing stripping gases consisting of oxygen, ozone, nitrous oxide and nitric oxide. More preferably, the oxygen containing stripping plasma 44 comprises oxygen. Most preferably, the oxygen containing stripping plasma 44 consists of oxygen. Preferably, the oxygen containing stripping plasma 44 also employs: (1) a reactor chamber pressure of from about 10 to about 20 torr; (2) a radio frequency power of from about 400 to about 750 watts at a radio frequency of 13.56 MHZ; (3) a substrate 30 temperature of from about 200 to about 300 degrees centigrade; and (4) an oxygen flow rate of from about 5000 to about 8000 standard cubic centimeters per minute (sccm).

Upon forming the microelectronics fabrication whose schematic cross-sectional diagram is illustrated in FIG. 7 there is formed a microelectronics fabrication having formed therein through use of a fluorine containing plasma etch method a via through a low dielectric constant dielectric layer formed of a silsesquioxane spin-on-glass (SOG) dielectric material, where the via is formed with attenuated lateral etching of the via when there is stripped from the microelectronics fabrication through an oxygen containing plasma stripping method a patterned photoresist layer employed in defining the via and a fluorocarbon polymer residue layer formed upon a sidewall of the via incident to the fluorine containing plasma etch method.

SECOND PREFERRED EMBODIMENT

Figure 8:
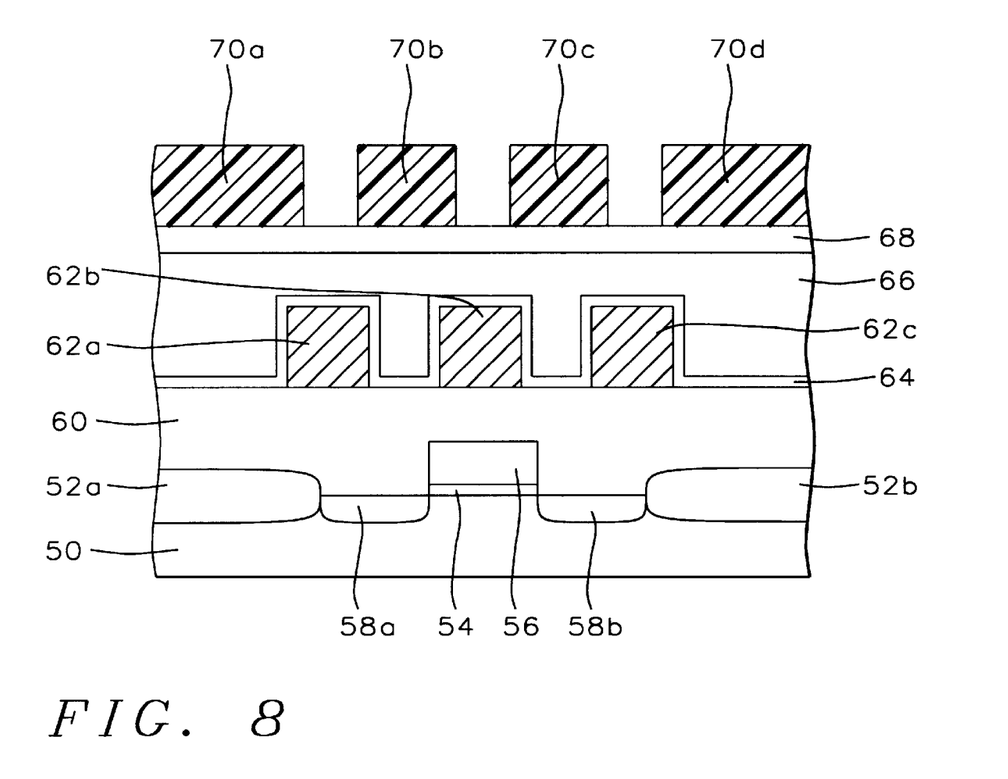
FIG. 8 to FIG. 11 show a series of schematic cross-sectional diagrams illustrating the results of forming within an integrated circuit microelectronics fabrication in accord with a more specific preferred embodiment of the present invention which comprises a second preferred embodiment of the present invention a series of interconnection vias through a sandwich composite low dielectric constant dielectric layer formed employing in-part a silsesquioxane spin- on-glass (SOG) dielectric material, with attenuated lateral etching the series of interconnection vias.

Referring now to FIG. 8 to FIG. 11, there is shown a series of schematic cross-sectional diagrams illustrating the results of forming within an integrated circuit microelectronics fabrication in accord with a more specific preferred embodiment of the present invention which comprises a second preferred embodiment of the present invention an interconnection via through a sandwich composite low dielectric constant dielectric layer formed employing in-part a silsesquioxane spin-on-glass (SOG) dielectric material, with attenuated laterally etching of the interconnection via. Shown in FIG. 8 is a schematic cross-sectional diagram of the integrated circuit microelectronics fabrication at an early stage in its fabrication.

Shown in FIG. 8 is a semiconductor substrate 50 having formed within and upon its surface a pair of isolation regions 52a and 52b which define an active region of the semiconductor substrate 50. Although it is known in the art of integrated circuit microelectronics fabrication that semiconductor substrates are available with either dopant polarity, various dopant concentrations and several crystallographic orientations, for the second preferred embodiment of the present invention the semiconductor substrate 50 is preferably a (100) silicon semiconductor substrate having an N- or P-doping.

Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the second preferred embodiment of the present invention the isolation regions 52a and 52b are preferably formed within and upon the semiconductor substrate 50 to define the active region of the semiconductor substrate 50 through an isolation region thermal growth method to form the isolation regions 52a and 52b of silicon oxide within and upon the semiconductor substrate 50.

Shown also within FIG. 8 formed within and upon the active region of the semiconductor substrate 50 is a field effect transistor (FET) which comprise a series of structures including: (1) a gate dielectric layer 54 formed upon the active region of the semiconductor substrate 50, the gate dielectric layer 54 having formed and aligned thereupon; (2) a gate electrode 56; and (3) a pair of source/drain regions 58a and 58b formed within the active region of the semiconductor substrate 50 at areas not covered by the gate dielectric layer 54 and the gate electrode 56. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the second preferred embodiment of the present invention the gate dielectric layer 54 is preferably formed through patterning, through methods as are conventional in the art, of a blanket gate dielectric layer formed through a blanket gate dielectric layer thermal growth method to form the gate dielectric layer 54 of silicon oxide upon the active region of the semiconductor substrate 50.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 56 is preferably formed through patterning, through methods as are conventional in the art, of a blanket layer of a doped polysilicon or polycide gate electrode material formed upon the blanket gate dielectric layer.

Finally, it is also known in the art of field effect transistor (FET) fabrication that source/drain regions are typically formed into active regions of a semiconductor substrate through ion implantation methods employing dopant ions of polarity opposite the polarity of the semiconductor substrate within which is formed those source/drain regions. For the second preferred embodiment of the present invention, the source/drain regions 58a and 58b are preferably formed within the active region of the semiconductor substrate 50 through a high dose ion implant while employing at least the gate electrode 56 and the gate dielectric layer 54 as an ion implantation mask. The high dose ion implant is of polarity appropriate to the field effect transistor (FET) and the semiconductor substrate 50.

There is also shown within FIG. 8 formed over the semiconductor substrate 50 and the series of structures which forms the field effect transistor (FET) a planarized pre-metal dielectric (PMD) layer 60. Methods and materials through which planarized pre-metal dielectric (PMD) layers may be formed within integrated circuit microelectronics fabrications are known in the art of integrated circuit microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD)

methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 50 is preferably formed of a silicon oxide dielectric material deposited through a plasma enhanced chemical vapor deposition (PECVD) method and subsequently planarized through a chemical mechanical polish (CMP) planarizing method, as is common in the art of integrated circuit microelectronics fabrication. Other methods and materials may, however, also be employed in forming the planarized pre-metal dielectric (PMD) layer 60. Preferably, the planarized pre-metal dielectric (PMD) layer 60 so formed is formed to a thickness of from about 6000 to about 10000 angstroms over the semiconductor substrate 50 and the series of structures which forms the field effect transistor (FET).

Similarly, there is also shown in FIG. 8 formed upon the planarized pre-metal dielectric (PMD) layer 60 a plurality of patterned conductor layers 62a, 62b and 62c. Methods and materials through which patterned conductor layers may be formed within integrated circuit microelectronics fabrications are known in the art of integrated circuit microelectronics fabrication. Patterned conductor layers may be formed within integrated circuit microelectronics fabrications through patterning, through methods as are conventional in the art, of blanket conductor layers formed within integrated circuit microelectronics fabrications. The blanket conductor layers may be formed of conductor materials including but not limited to metals, metal alloys, doped polysilicon and polycides (doped polysilicon/metal silicide stacks). For the second preferred embodiment of the present invention, the plurality of patterned conductor layers 62a, 62b and 62c is preferably formed through patterning, through methods as are conventional in the art, of a blanket conductor layer formed at least in part of an aluminum containing conductor material, although other methods and materials may be employed in forming the plurality of patterned conductor layers 62a, 62b and 62c.

Although not specifically illustrated within the schematic cross-sectional diagram of FIG. 8, each of the patterned conductor layers 62a, 62b or 62c within the plurality of patterned conductor layers 62a, 62b and 62c is preferably formed with: (1) a linewidth of from about 0.3 to about 1 microns; (2) an aspect ratio of from about 0.5 to about 2; and (3) a separation distance (ie: pitch) from an adjoining patterned conductor layer 62a, 62b or 62c of from about 0.3 to about 1 microns.

Shown also within FIG. 8 formed conformally upon the exposed surfaces of the planarized pre-metal dielectric (PMD) layer 60 and the plurality of patterned conductor layers 62a, 62b and 62c is a blanket conformal inter-metal dielectric (IMD) lower liner layer 64. Methods and materials through which conformal inter-metal dielectric liner layers may be formed within integrated circuit microelectronics fabrication are known in the art of integrated circuit microelectronics fabrication. Conformal inter-metal dielectric (IMD) liner layers may be formed within integrated circuit microelectronics fabrications through methods and materials analogous to the methods and materials through which may be formed planarized pre-metal dielectric (PMD) layers within integrated circuit microelectronics fabrications, with the exception that conformal inter-metal dielectric (IMD) liner layers within integrated circuit microelectronics fabrications are not planarized. Thus, for the second preferred embodiment of the present invention, the blanket conformal inter-metal dielectric (IMD) lower liner layer 64 is preferably formed through methods and materials analogous or equivalent to the methods and materials through which is formed the planarized pre-metal dielectric (PMD) layer 60, with the exception that the blanket conformal inter-metal dielectric (IMD) lower liner layer 64 is not planarized. More preferably, the blanket conformal inter-metal dielectric (IMD) lower liner layer 64 so formed is formed to a thickness of from about 1000 to about 2000 angstroms from a silicon oxide dielectric material deposited through a plasma enhanced chemical vapor deposition (PECVD) method.

There is also shown in FIG. 8 formed upon the blanket conformal inter-metal dielectric lower liner layer 64 a blanket gap filling inter-metal dielectric (IMD) layer 66. Within the second preferred embodiment of the present invention, the blanket gap filling inter-metal dielectric (IMD) layer 66 is a blanket low dielectric constant dielectric layer formed of a silsesquioxane spin-on-glass (SOG) dielectric material. Thus, the blanket gap filling inter-metal dielectric (IMD) layer 66 within the second preferred embodiment of the present invention is preferably formed through methods and materials analogous or equivalent to the methods and materials employed in forming the blanket low dielectric constant dielectric layer 32 within the first preferred embodiment of the present invention as illustrated in FIG. 4. Preferably, the blanket gap filling inter-metal dielectric (IMD) layer 66 so formed is formed to a thickness of from about 3000 to about 5000 angstroms.

There is also shown in FIG. 8 formed upon the blanket gap filling inter-metal dielectric (IMD) layer 66 a blanket conformal inter-metal dielectric (IMD) upper capping layer 68. Within the second preferred embodiment of the present invention, the blanket conformal inter-metal dielectric (IMD) upper capping layer 68 is preferably formed through methods and materials analogous or equivalent to the methods and materials employed in forming the blanket conformal inter-metal dielectric (IMD) lower liner layer 64. Preferably, the blanket conformal inter-metal dielectric (IMD) upper capping layer 68 so formed is formed to a thickness of from about 2000 to about 5000 angstroms.

Finally, there is shown in FIG. 8 a series of patterned photoresist layers 70a, 70b, 70c and 70d formed upon the blanket conformal inter-metal dielectric (IMD) upper capping layer 68. Within the second preferred embodiment of the present invention, the series of patterned photoresist layers 70a, 70b, 70c and 70d is preferably formed through methods and materials, and to dimensions, analogous or equivalent to the methods, materials and dimensions employed in forming the pair of patterned photoresist layers 34a and 34b within the first preferred embodiment of the present invention as illustrated within the microelectronics fabrication whose schematic cross-sectional diagram is illustrated in FIG. 4.

Figure 9:
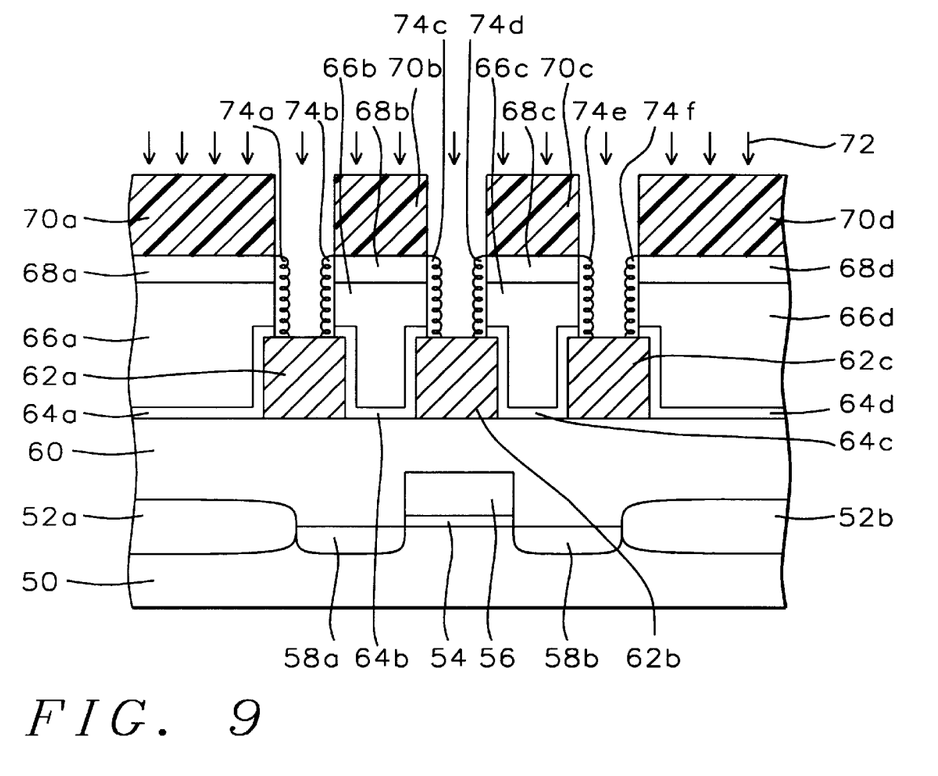

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein the blanket conformal inter-metal dielectric (IMD) upper capping layer 68, the blanket gap filling inter-metal dielectric (IMD) layer 66 and the blanket conformal inter-metal dielectric (IMD) lower liner layer 64 have been patterned to form the corresponding patterned conformal inter-metal dielectric (IMD) upper capping layers 68a, 68b, 68c and 68d, the corresponding patterned gap filling inter-metal dielectric (IMD) layers 66a, 66b, 66c and 66d and the corresponding patterned conformal inter-metal dielectric (IMD) lower liner layers 64a, 64b, 64c and 64d, while employing the patterned photoresist layers 70a, 70b, 70c and 70d as an etch mask layer, through use of a fluorine containing etching plasma 72 to form a series of interconnection vias which access the patterned conductor layers 62a, 62b and 62c.

Within the second preferred embodiment of the present invention, the fluorine containing etching plasma 72 is preferably formed through methods and materials analogous or equivalent to the methods and materials employed in forming the fluorine containing etching plasma 36 within the first preferred embodiment of the present invention as illustrated in FIG. 5. Thus, similarly with the first preferred embodiment of the present invention, there is formed upon the interconnection via sidewalls within the second preferred embodiment of the present invention as illustrated in FIG. 9 a series of fluorocarbon polymer residue layers 74a, 74b, 74c, 74d, 74e and 74f.

Figure 10:
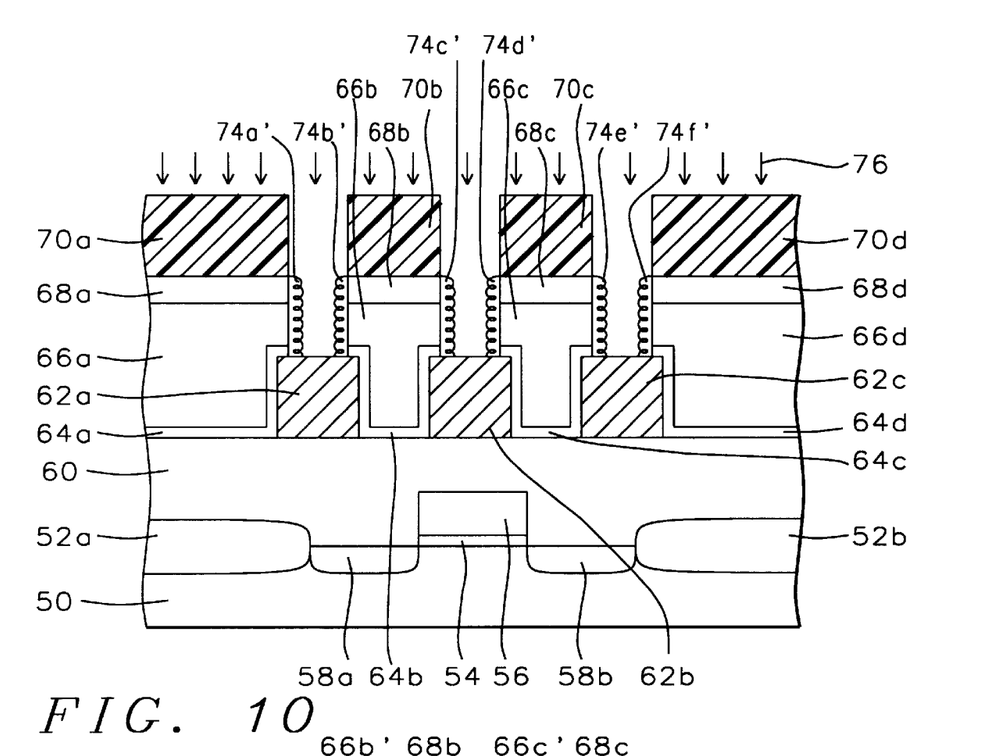

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein the fluorocarbon polymer residue layers 74a, 74b, 74c, 74c, 74d and 74e have been treated with a fluorocarbon polymer residue layer treatment plasma 76 to form the plasma treated fluorocarbon polymer residue layers 74a', 74b', 74c', 74d', 74e' and 74f'. Within the second preferred embodiment of the present invention, the fluorocarbon polymer residue layer treatment plasma 76 is preferably formed through methods and materials analogous or equivalent to the methods and materials employed in forming the fluorocarbon polymer residue layer treatment plasma 42 within the first preferred embodiment of the present invention as illustrated within the schematic cross-sectional diagram of FIG. 6. Thus, within the second preferred embodiment of the present invention, the plasma treated fluorocarbon polymer residue layers 74a', 74b', 74c', 74d', 74e' and 74f' are formed analogously or equivalently to the plasma treated fluorocarbon polymer residue layers 38a' and 38b' within the first preferred embodiment of the present invention as illustrated in FIG. 6.

Figure 11:
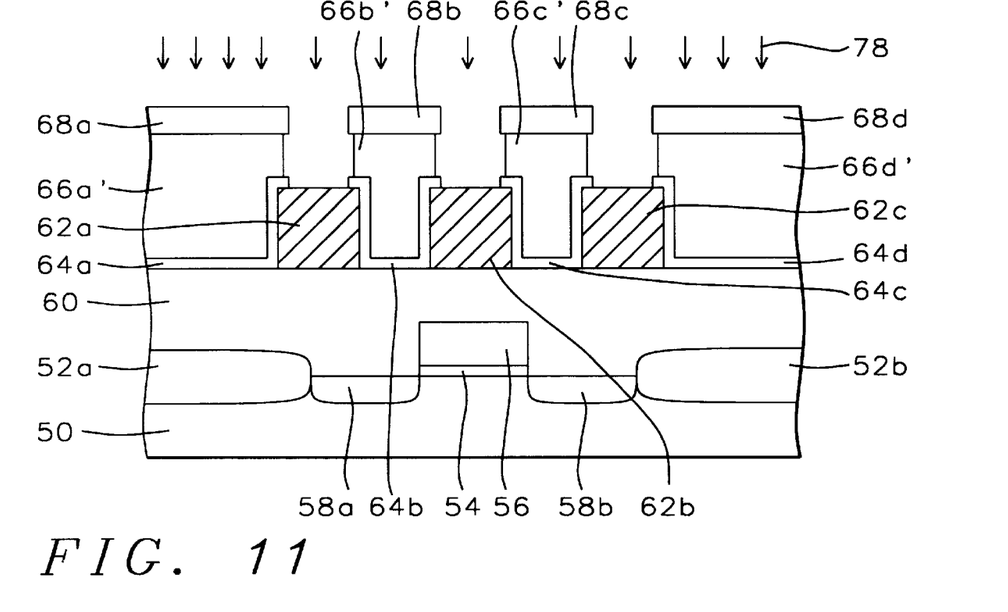

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein the patterned photoresist layers 70a, 70b, 70c and 70d, and the plasma treated fluorocarbon polymer residue layers 74a', 74b', 74c', 74d', 74e' and 74f', are stripped from the integrated circuit microelectronics fabrication through use of an oxygen containing stripping plasma 78. Within the second preferred embodiment of the present invention, the oxygen containing stripping plasma 78 preferably employs methods and materials analogous or equivalent to the methods and materials employed in forming the oxygen containing stripping plasma 44 within the first preferred embodiment of the present invention as illustrated in FIG. 7. As is illustrated in FIG. 11, when the patterned photoresist layers 70a, 70b, 70c and 70d and the plasma treated fluorocarbon polymer residue layers 74a', 74b', 74c', 74d', 74e' and 74f' are stripped within the oxygen containing stripping plasma 78, there is simultaneously formed slightly laterally etched patterned low dielectric constant dielectric layers 66a', 66b', 66c' and 66d' within the interconnection vias accessing the patterned conductor layers 62a, 62b and 62c.

Due to the presence within the second preferred embodiment of the present invention of the fluorocarbon polymer residue layer treatment plasma 76 for treating the fluorocarbon polymer residue layers 74a, 74b, 74c, 74d, 74e and 74f when forming the plasma treated fluorocarbon polymer residue layers 74a', 74b', 74c', 74d', 74e' and 74f', the slightly laterally etched patterned low dielectric constant dielectric layers 66a', 66b', 66c' and 66d' are formed with attenuated lateral etching in comparison with the laterally etched patterned low dielectric constant dielectric layers 12a' and 12b' as discussed within the Description of the Related Art and illustrated in FIG. 3.

Upon forming the integrated circuit microelectronics fabrication whose schematic cross-sectional diagram is illustrated in FIG. 11, there is formed an integrated circuit microelectronics fabrication having formed therein a series of interconnection vias through an inter-metal dielectric (IMD) layer formed in part of a silsesquioxane spin-on-glass (SOG) dielectric material, where when stripping from the integrated circuit microelectronics fabrication: (1) a patterned photoresist layer employed in defining the locations of the vias; and (2) a series of fluorocarbon polymer residue layers from the sidewalls of the interconnection vias, there is avoided lateral etching of the vias.

Thus, the integrated circuit microelectronics fabrication whose schematic cross-sectional diagram is illustrated in FIG. 11 may have formed within the series of vias accessing the patterned conductor layers 62a, 62b and 62c a series of conductive interconnection stud layers with attenuated void formation within the conductive interconnection stud layers.

As is understood by a person skilled in the art, while the second preferred embodiment of the present invention illustrates the method of the present invention employed in forming a series of vias through a first inter-metal dielectric (IMD) layer within an integrated circuit microelectronics fabrication, the method of the present invention may also be employed in forming contact vias through pre-metal dielectric (PMD) layers within integrated circuit microelectronics fabrications, as well as interconnection vias through upper lying inter-metal dielectric layers and passivation layers within integrated circuit microelectronics fabrications. Typically and preferably, the second preferred embodiment of the present invention is employed in forming interconnection vias through inter-metal dielectric layers within integrated circuit microelectronics fabrications since it is typically most desirable to form within integrated circuit microelectronics fabrications inter-metal dielectric (IMD) layers from low dielectric constant dielectric layers formed from silsesquioxane spin-on-glass (SOG) dielectric materials.

Similarly, although also not illustrated within the schematic cross-sectional diagrams corresponding with the first preferred embodiment of the present invention or the second preferred embodiment of the present invnetion, it is preferred within the method of the present invention to undertake at least two, and preferably three, of: (1) the fluorine containing plasma etch method; (2) the fluorocarbon polymer residue layer plasma treatment method; and (3) the oxygen containing plasma stripping method, in-situ within a single plasma reactor chamber or within adjoining reactor chambers within a single plasma reactor cluster tool. Under such circumstances there is provided by the present invention enhanced manufacturing efficiency, decreased adventitious contamination and enhanced manufacturing yield when forming vias through low dielectric constant dielectric layers formed of silsesquioxane spin-on-glass (SOG) dielectric materials through the method of the present invention.

EXAMPLES

Upon each semiconductor substrate within two series of semiconductor substrates was formed a blanket low dielectric constant dielectric layer formed of a methyl silsesquioxane spin-on-glass (SOG) dielectric material of chemical formula ($CH_3$—$Si(OC_2H_5)_3$). The blanket low dielectric constant dielectric layers were formed through spin-coating an alcoholic solution of the methyl silsesquioxane spin-on-glass (SOG) dielectric material and thermally curing at a temperature of about 450 degrees centigrade to form the blanket low dielectric constant dielectric layers of thickness about 3000 angstroms each.

Upon each blanket low dielectric constant dielectric layer was formed a blanket silicon containing dielectric layer formed of a silicon oxide dielectric material deposited through a plasma enhanced chemical vapor deposition (PECVD) method as is otherwise conventional in the art of integrated circuit microelectronics fabrication. Each of the blanket silicon containing dielectric layers was formed to a thickness of from about 5000 angstroms.

There was then formed upon each of the blanket silicon containing dielectric layers a patterned photoresist layer from a positive photoresist material. Each patterned photoresist layer was formed to a thickness of about 10000 angstroms to define a series of circular apertures within the patterned photoresist layer of diameter about 4000 angstroms.

One of the two series of semiconductor substrates was then etched through use of a fluorine containing plasma etch method employing a fluorine containing etching plasma while employing the series of patterned photoresist layers as photoresist etch mask layers to form a series of vias through the blanket silicon containing dielectric layers and the blanket low dielectric constant dielectric layers. The fluorine containing etching plasma employed an etchant gas composition consisting of carbon tetrafluoride and trifluoromethane. The fluorine containing plasma etch method also employed: (1) a reactor chamber pressure of about 150 mtorr; (2) a radio frequency power of about 1000 watts at a radio frequency of 13.56 MHz; (3) a semcionductor substrate temperature of about 15 degrees centigrade; (4) a carbon tetrafluoride flow rate of about 60 standard cubic centimeters per minute (sccm); and (5) a trifluoromethane flow rate of about 30 standard cubic centimeters per minute (sccm). When etching the series of vias through the blanket silicon containing dielectric layers and the blanket low dielectric constnat dielectric layers to reach the semiconductor substrates there was formed a series of fluorocarbon polymer residue layers upon the sidewalls of the vias.

The fluorocarbon polymer residue layers formed upon the sidewalls of the vias were then treated with a fluorocarbon polymer residue layer treatment plasma in accord with the preferred embodiments of the present invention. The fluorocarbon polymer residue layer treatment plasma employed an argon etchant gas only. The fluorocarbon polymer residue layer treatment plasma also employed: (1) a reactor chamber pressure of from about 50 mtorr; (2) a radio frequency power of about 1000 watts at a radio frequency of 13.56 MHz; (3) a semiconductor substrate temperature of about 15 degrees centigrade; and (4) an argon flow rate of about 100 standard cubic centimeters per minute (sccm).

There was then stripped from the first series of semcionductor substrates the series of patterned photoresist layers and the series of plasma treated fluorocarbon polymer residue layers through use of an oxygen containing plasma stripping method employing an oxygen containing stripping plasma. The oxygen containing plasma stripping method employed oxygen only, although it is believed that similar results would be obtained addition of hexafluoroethane to the oxygen containing stripping plasma. The oxygen containing plasma stripping method also employed: (1) a reactor chamber pressure of about 10 torr; (2) a radio frequency power of about 600 watts at a radio frequency of 13.56 MHz; (3) a semiconductor substrate temperature of about 250 degrees centigrade; and (4) an oxygen flow rate of about 8000 standard cubic centimeters per minute (sccm).

The second series of the two series of semiconductor substrates was treated otherwise equivalently to the first series of the two series of semiconductor substrates, but without employing the fluorocarbon polymer residue layer plasma treatment method.

Sample semiconductor substrates within the two series of semiconductor substrates were then cleaved vertically through the vias and the widths of the vias were measured employing scaning electron microscopy inspections at: (1) a location separating a pair of patterned silicon containig dielectric layers within a via; and (2) a location separating a pair of patterned low dielectric constant dielectric layers within the via. The results of the scanning electron microscopy measurements are reported in Table I.

TABLE I

| Example | Via Processing Plasmas | Width at SiO2 Layer microns | Width at Low K microns | Diff. microns |
| --- | --- | --- | --- | --- |
| 1 | CF4 → Ar → O2 | 0.38 | 0.39 | 0.01 |
| 2 | CF4 → O2 | 0.38 | 0.41 | 0.03 |

As is seen from review of the data within Table I, by incorporating the argon fluorocarbon polymer residue layer plasma treatment method in accord with the preferred embodiments of the present invention intervening a fluorine containing etching plasma and an oxygen containig stripping plasma when forming within a microelectronics fabrication a via through a low dielectric constant dielectric layer formed of a silsesquioxane spin-on-glass (SOG) dielectric material, there is formed in accord with the method of the present invention the via with attenuated lateral etching of a low dielectric constant dielectric layer formed of the silsesquioxane spin-on-glass (SOG) dielectric layer.

As is understood by a person skilled in the art, the preferred embodiments of the present invention are illustrative of the present invention rather than limiting of the present invention. Revisions and modifications may be made to methods, materials, structures and dimensions through which is provided the preferred embodiments of the present invention while still providing embodiments which are within the spirit and scope of the present invention, as defined by the appended claims.

What is claimed is:

1. A method for forming a via through a dielectric layer within a microelectronics fabrication comprising:

providing a substrate employed within a microelectronics fabrication;

forming over the substrate a dielectric layer, the dielectric layer being formed from a silsesquioxane spin-on-glass (SOG) dielectric material;

forming over the dielectric layer a patterned photoresist layer;

etching through use of a fluorine containing plasma etch method while employing the patterned photoresist layer as a photoresist etch mask layer the dielectric layer to form a patterned dielectric layer having a via formed therethrough, the fluorine containing plasma etch method employing a fluorine containing etchant gas composition which simultaneously forms a fluorocarbon polymer residue layer upon a sidewall of the via;

treating through use of a plasma treatment method the fluorocarbon polymer residue layer to form a plasma treated fluorocarbon polymer residue layer, the plasma treated fluorocarbon polymer residue layer being susceptible, in comparison with the fluorocarbon polymer residue layer, to being stripped from the sidewall of the via through an oxygen containing plasma stripping method employed in stripping from the microelectronics fabrication the patterned photoresist layer with attenuated lateral etching of the patterned dielectric layer; and stripping through use of the oxygen containing plasma stripping method the patterned photoresist layer from over patterned dielectric layer and the plasma treated fluorocarbon polymer residue layer from upon the sidewall of the via.

2. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

3. The method of claim 1 wherein the silsesquioxane spin-on-glass (SOG) dielectric material is chosen from the group of silsesquioxane spin-on-glass (SOG) dielectric materials consisting of hydrogen silsesquioxane spin-on-glass (SOG) dielectric materials, carbon bonded organo functional silsesquioxane spin-on-glass (SOG) dielectric materials and carbon bonded fluorocarbon functional silsesquioxane spin-on-glass (SOG) dielectric materials.

4. The method of claim 1 wherein the fluorine containing plasma etch method employs a fluorine containing etchant gas chosen from the group of fluorine containing etchant gases consisting of perfluorocarbons, hydrofluorocarbons, sulfur hexafluoride and nitrogen trifluoride.

5. The method of claim 1 wherein the plasma treatment method employs a plasma treatment gas chosen from the group of plasma treatment gases consisting of argon, neon, krypton and xenon.

6. The method of claim 1 wherein the oxygen containing plasma stripping method employs an oxygen containing stripping gas chosen from the group of oxygen containing stripping gases consisting of oxygen, ozone, nitrous oxide and nitric oxide.

7. A microelectronics fabrication fabricated in accord with the method of claim 1.

8. A method for forming a via through a dielectric layer within an integrated circuit microelectronics fabrication comprising:

providing a semiconductor substrate employed within an integrated circuit microelectronics fabrication, the semiconductor substrate having a field effect transistor (FET) formed thereupon;

forming over the semiconductor substrate a dielectric layer, the dielectric layer being formed from a silsesquioxane spin-on-glass (SOG) dielectric material;

forming over the dielectric layer a patterned photoresist layer;

etching through use of a fluorine containing plasma etch method while employing the patterned photoresist layer as a photoresist etch mask layer the dielectric layer to form a patterned dielectric layer having a via formed therethrough, the fluorine containing plasma etch method employing a fluorine containing etchant gas composition which simultaneously forms a fluorocarbon polymer residue layer upon a sidewall of the via;

treating through use of a plasma treatment method the fluorocarbon polymer residue layer to form a plasma treated fluorocarbon polymer residue layer, the plasma treated fluorocarbon polymer residue layer being susceptible, in comparison with the fluorocarbon polymer residue layer, to being stripped from the sidewall of the via through an oxygen containing plasma stripping method employed in stripping from the microelectronics fabrication the patterned photoresist layer with attenuated lateral etching of the patterned dielectric layer; and stripping through use of the oxygen containing plasma stripping method the patterned photoresist layer from over patterned dielectric layer and the plasma treated fluorocarbon polymer residue layer from upon the sidewall of the via.

9. The method of claim 8 wherein the silsesquioxane spin-on-glass (SOG) dielectric material is chosen from the group of silsesquioxane spin-on-glass (SOG) dielectric materials consisting of hydrogen silsesquioxane spin-on-glass (SOG) dielectric materials, carbon bonded organo functional silsesquioxane spin-on-glass (SOG) dielectric materials and carbon bonded fluorocarbon functional silsesquioxane spin-on-glass (SOG) dielectric materials.

10. The method of claim 8 wherein the fluorine containing plasma etch method employs a fluorine containing etchant gas chosen from the group of fluorine containing etchant gases consisting of perfluorocarbons, hydrofluorocarbons, sulfur hexafluoride and nitrogen trifluoride.

11. The method of claim 8 wherein the plasma treatment method employs a plasma treatment gas chosen from the group of plasma treatment gases consisting of argon, neon, krypton and xenon.

12. The method of claim 8 wherein the oxygen containing plasma stripping method employs an oxygen containing stripping gas chosen from the group of oxygen containing stripping gases consisting of oxygen, ozone, nitrous oxide and nitric oxide.

13. A microelectronics fabrication fabricated in accord with the method of claim 8.

* * * * *